United States Patent
Asakawa et al.

(10) Patent No.: US 10,429,664 B2
(45) Date of Patent: Oct. 1, 2019

(54) SEMICONDUCTOR LASER, SEMICONDUCTOR LASER SET AND DISPLAY DEVICE

(71) Applicant: Japan Display Inc., Minato-ku (JP)

(72) Inventors: Youichi Asakawa, Tokyo (JP); Ken Onoda, Tokyo (JP); Toshihiko Fukuma, Tokyo (JP); Shinichi Komura, Tokyo (JP)

(73) Assignee: Japan Display Inc., Minato-ku (JP)

(*) Notice: Subject to any disclaimer, the term of this patent is extended or adjusted under 35 U.S.C. 154(b) by 0 days.

(21) Appl. No.: 15/955,852

(22) Filed: Apr. 18, 2018

(65) Prior Publication Data

US 2018/0329224 A1 Nov. 15, 2018

(30) Foreign Application Priority Data

May 12, 2017 (JP) .................... 2017-095454

(51) Int. Cl.

| G02B 27/48 | (2006.01) |
|---|---|
| H01S 5/042 | (2006.01) |
| H01S 5/00 | (2006.01) |
| H01S 5/40 | (2006.01) |
| H01S 5/30 | (2006.01) |
| F21V 8/00 | (2006.01) |
| G02F 1/1335 | (2006.01) |

(52) U.S. Cl.
CPC ............ G02B 27/48 (2013.01); H01S 5/0078 (2013.01); H01S 5/0428 (2013.01); H01S 5/4012 (2013.01); H01S 5/4093 (2013.01); G02B 6/003 (2013.01); G02B 6/0046 (2013.01); G02B 6/0053 (2013.01); G02B 6/0068 (2013.01); G02F 1/133514 (2013.01); G02F 1/133621 (2013.01); H01S 5/3013 (2013.01); H01S 5/3018 (2013.01)

(58) Field of Classification Search
CPC .... G02B 27/48; G02B 6/0068; G02B 6/0046; G02B 6/0053; G02B 6/003; G02F 1/133514; G02F 1/133621; H01S 5/4012; H01S 5/4093; H01S 5/0078; H01S 5/0428; H01S 5/3013; H01S 5/3018
See application file for complete search history.

(56) References Cited

U.S. PATENT DOCUMENTS

| 5,301,014 A * | 4/1994 | Koch ................ G01N 21/39 |
|---|---|---|
| | | 250/343 |
| 2006/0045437 A1* | 3/2006 | Tatum ................ H01S 5/02248 |
| | | 385/92 |

FOREIGN PATENT DOCUMENTS

JP 2005-209988 8/2005

OTHER PUBLICATIONS

Kroll et al., "Measurement of gaseous oxygen using diode laser spectroscopy", Aug. 31, 1987, Appl. Phys. Lett, vol. 51, No. 18, pp. 1465-1467.*

* cited by examiner

Primary Examiner — Bao Q Truong
Assistant Examiner — Glenn D Zimmerman
(74) Attorney, Agent, or Firm — Oblon, McClelland, Maier & Neustadt, L.L.P.

(57) ABSTRACT

According to one embodiment, a semiconductor laser includes a semiconductor laser element. A drive current which is composed of a direct current and an alternating current superposed thereon is applied to the semiconductor laser element. A waveform of the alternating current is a non-square wave. A frequency of the alternating current is from 50 Hz to 500 kHz.

14 Claims, 13 Drawing Sheets

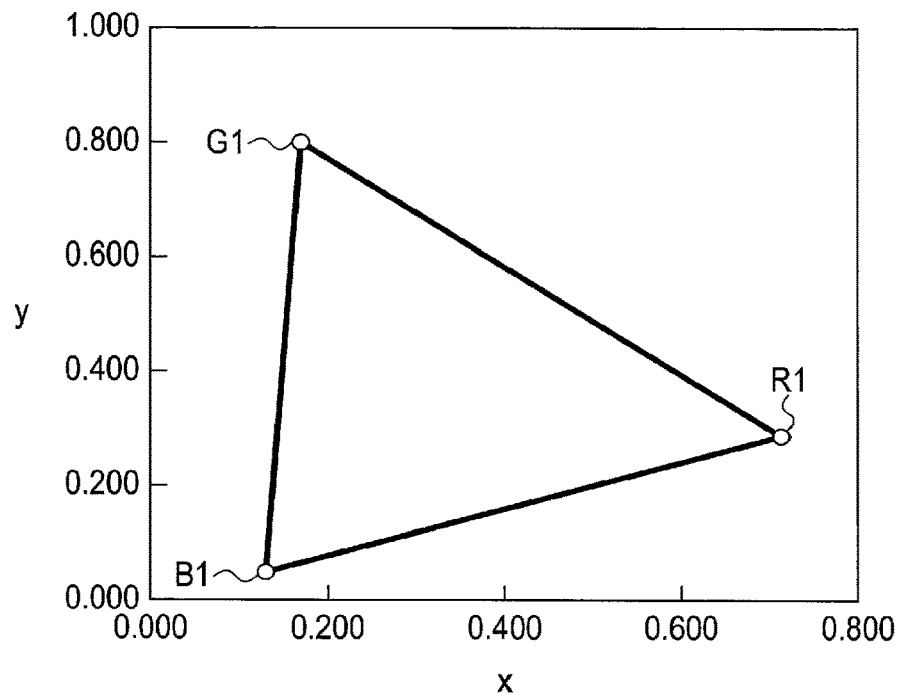
F I G. 6
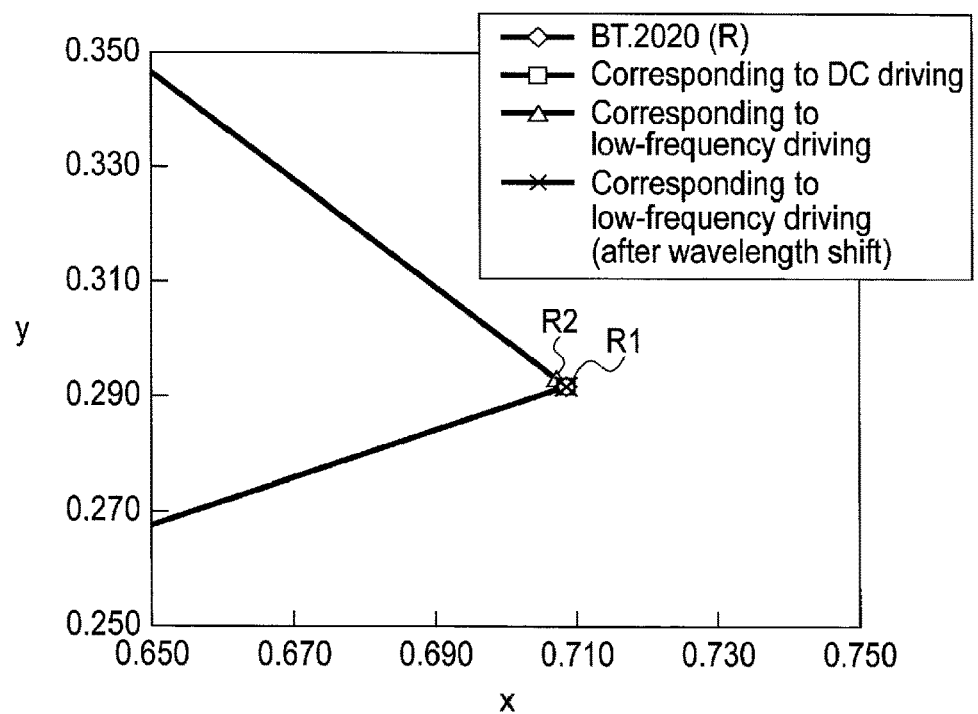
F I G. 7

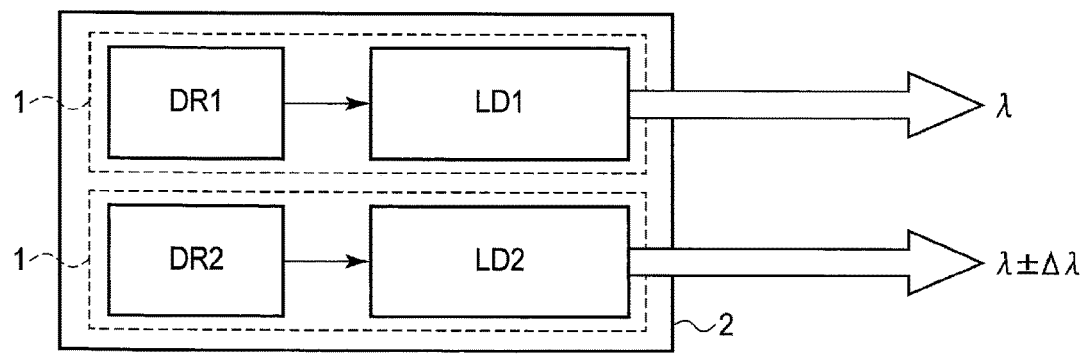
F I G. 10
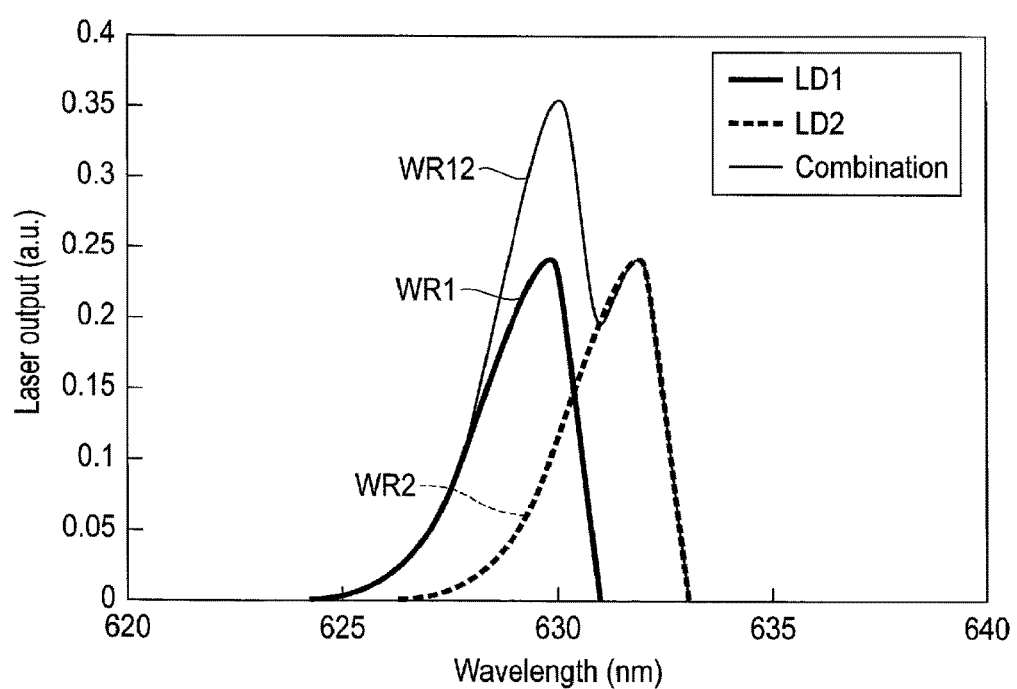
F I G. 11

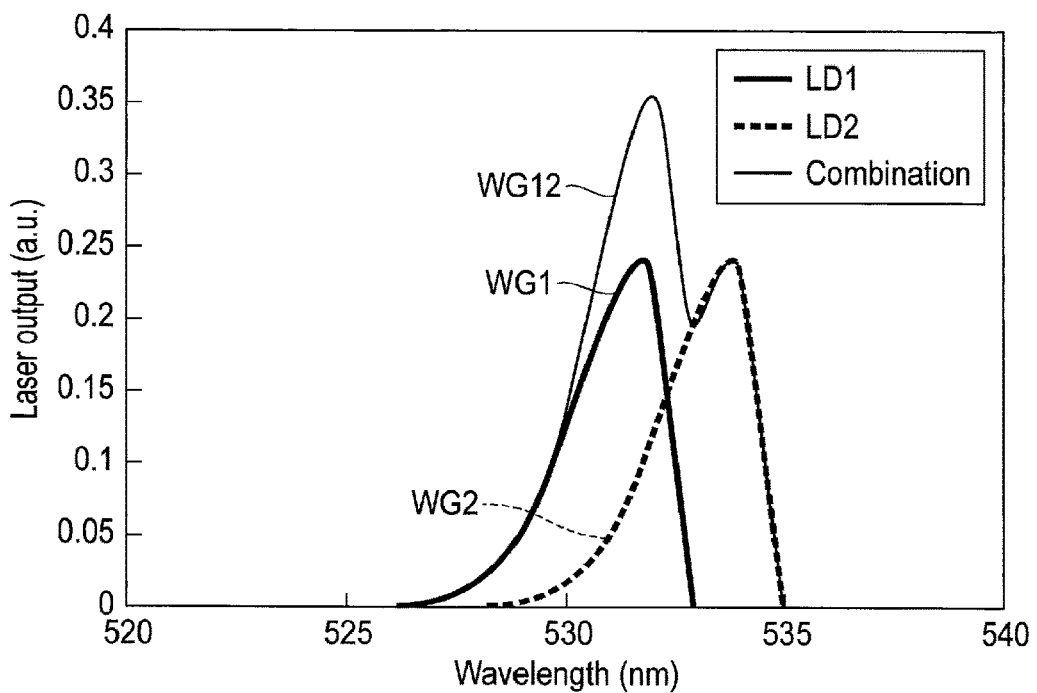
F I G. 12
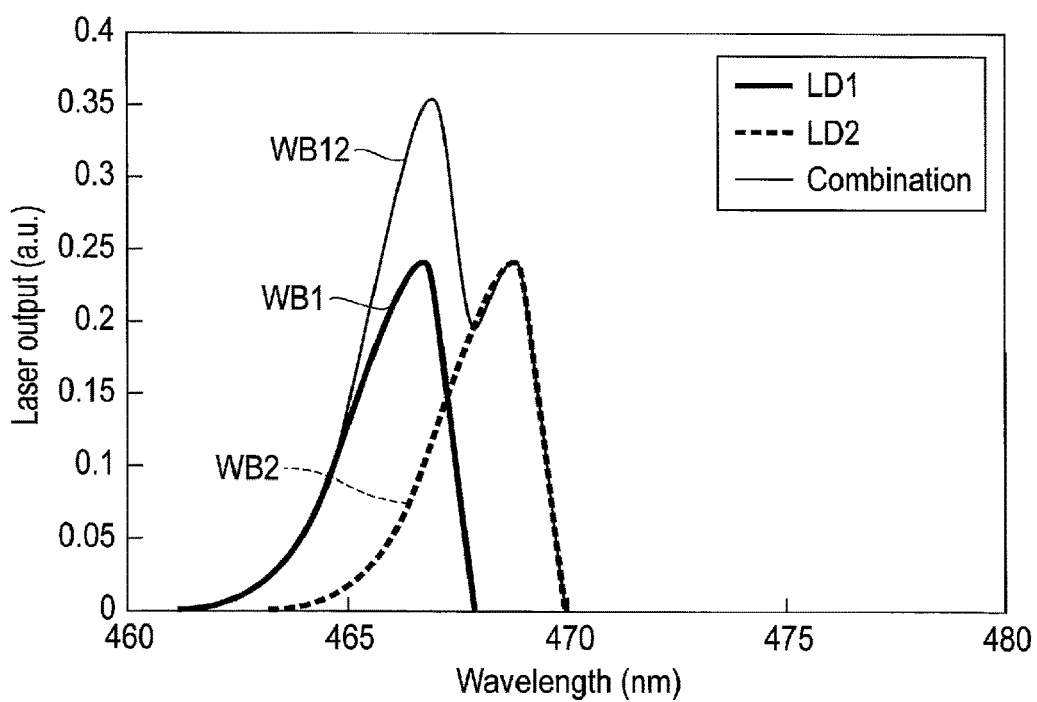
F I G. 13

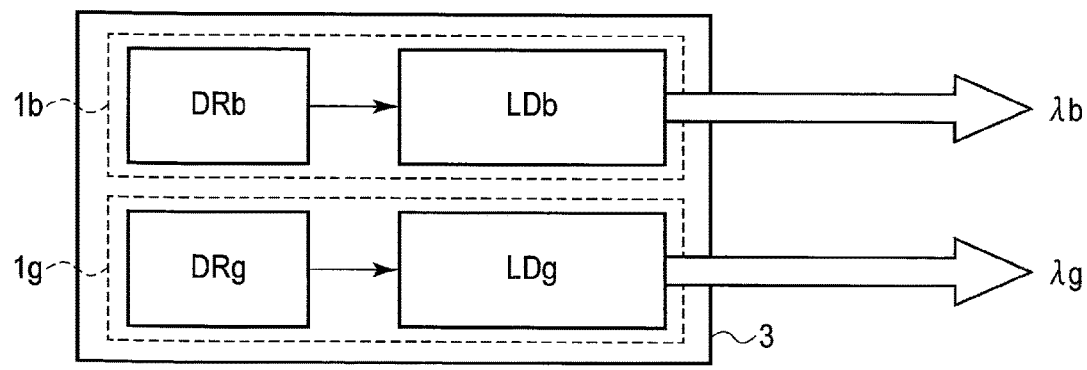
F I G. 14
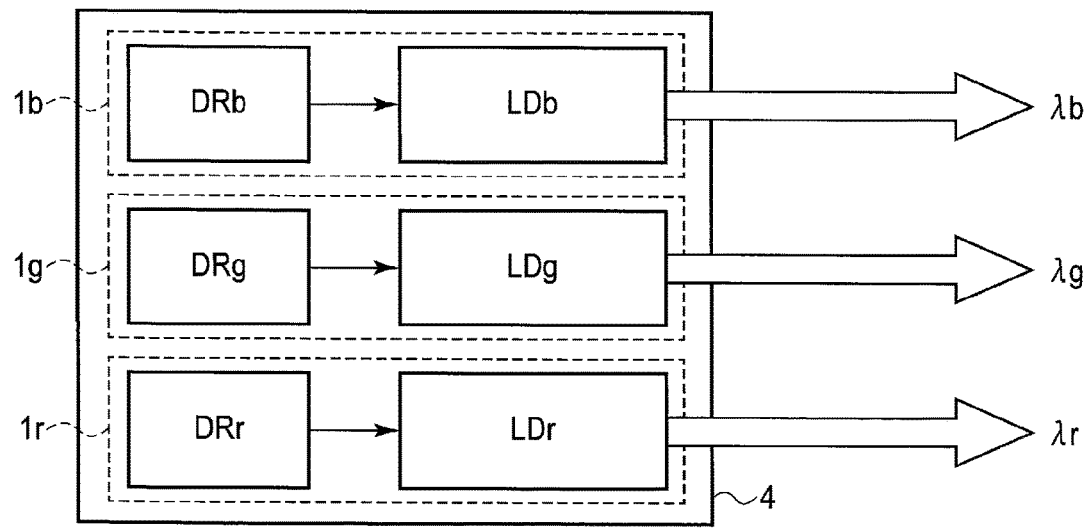
F I G. 15

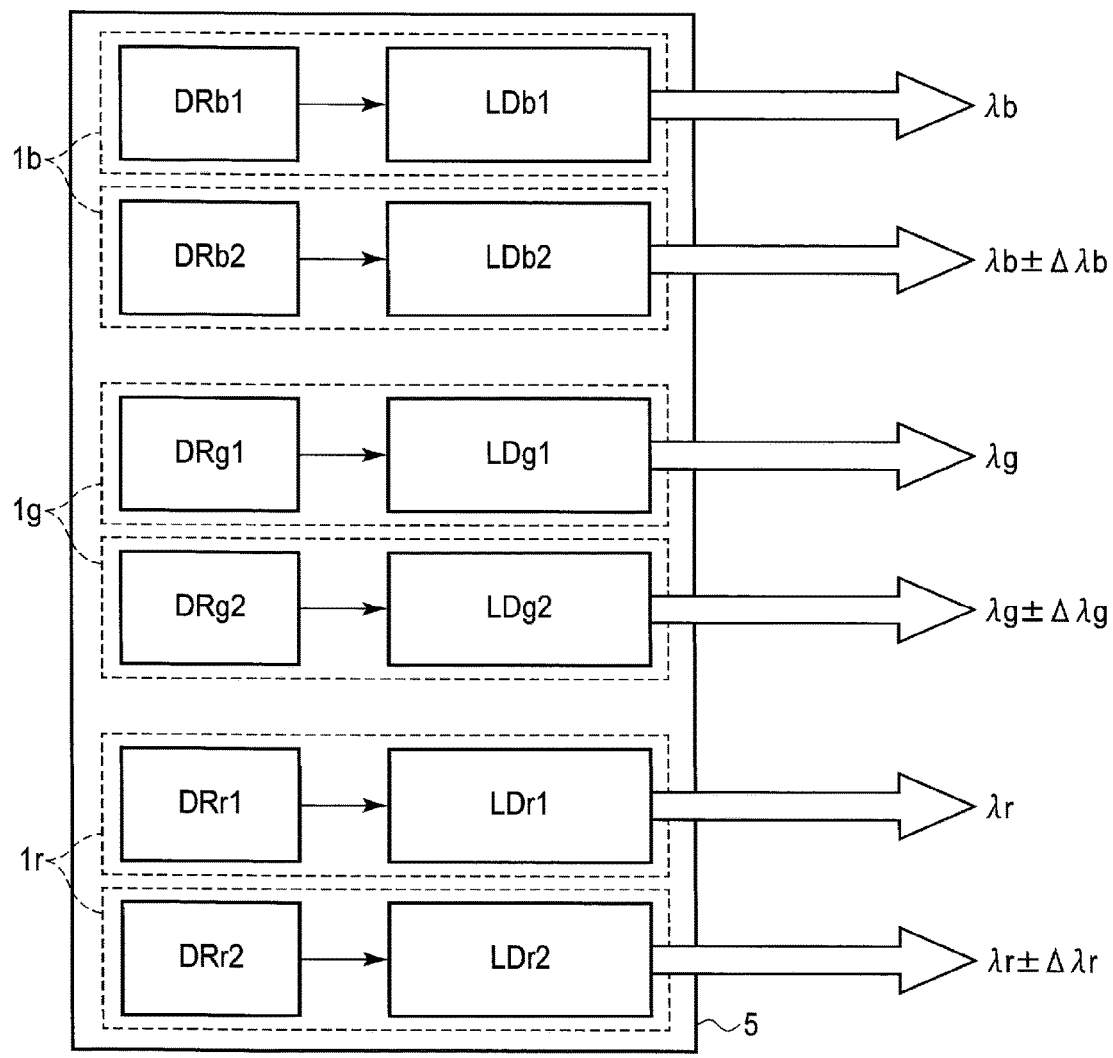
F I G. 16

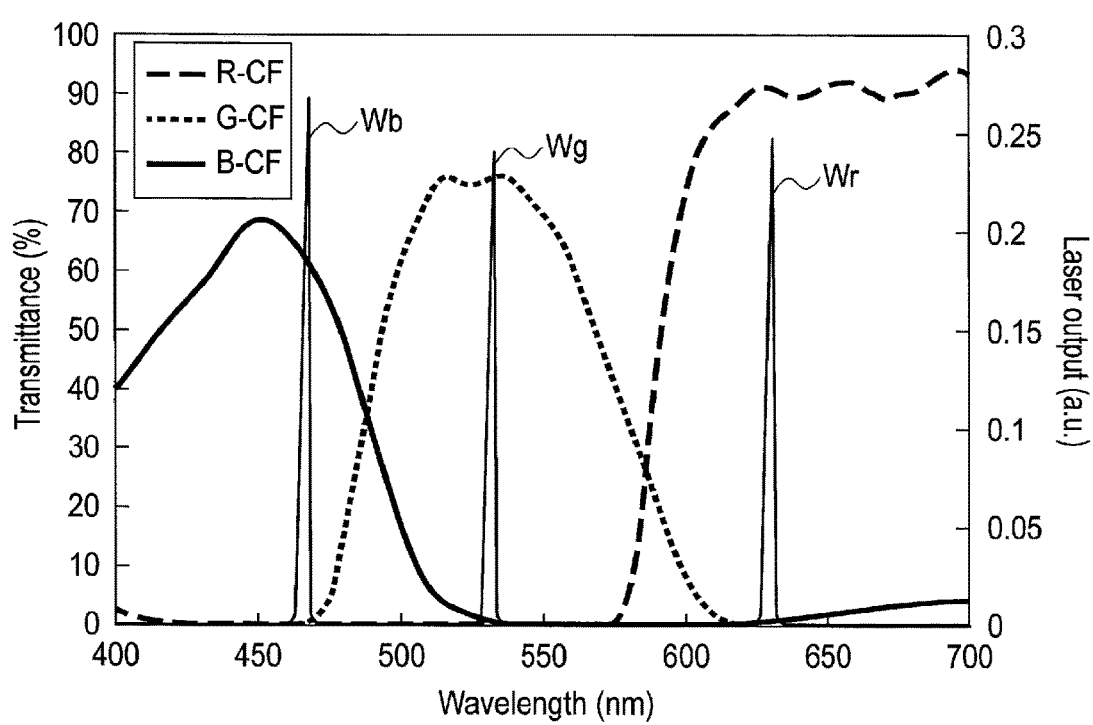
F I G. 17

SEMICONDUCTOR LASER, SEMICONDUCTOR LASER SET AND DISPLAY DEVICE

CROSS-REFERENCE TO RELATED APPLICATIONS

This application is based upon and claims the benefit of priority from Japanese Patent Application No. 2017-095454, filed May 12, 2017, the entire contents of which are incorporated herein by reference.

FIELD

Embodiments described herein relate generally to a semiconductor laser, a semiconductor laser set and a display device.

BACKGROUND

Laser light has a high level of coherence and therefore tends to cause speckle noise. Speckle noise may cause problems in various uses of laser light sources. Recently, display devices using semiconductor lasers as light sources have been considered. In these display devices, display quality may be degraded by speckle noise. Therefore, there is demand of speckle noise reduction.

Meanwhile, to reduce laser noise resulting from return light, a technique of driving a semiconductor laser by a drive current composed of a direct current and a high-frequency current superposed thereon is known.

BRIEF DESCRIPTION OF THE DRAWINGS

FIG. 6 is a chromaticity diagram showing a target color gamut.

FIG. 7 is an enlarged view of a red region including a point R1 in the chromaticity diagram shown in FIG. 6.

FIG. 10 is a diagram showing an example of the structure of a semiconductor laser set 2 according to the present embodiment.

FIG. 11 is a diagram showing an example of the emission wavelength range in the first structural example of the semiconductor laser set 2.

FIG. 12 is a diagram showing an example of the emission wavelength range in the second structural example of the semiconductor laser set 2.

FIG. 13 is a diagram showing an example of the emission wavelength range in the third structural example of the semiconductor laser set 2.

FIG. 14 is a diagram showing an example of the structure of a semiconductor laser set 3 according to the present embodiment.

FIG. 15 is a diagram showing an example of the structure of a semiconductor laser set 4 according to the present embodiment.

FIG. 16 is a diagram showing an example of the structure of a semiconductor laser set 5 according to the present embodiment.

FIG. 17 is a diagram showing the relationship between the emission wavelength ranges of semiconductor laser elements and the spectral transmittances of color filters.

DETAILED DESCRIPTION

Figure 1:
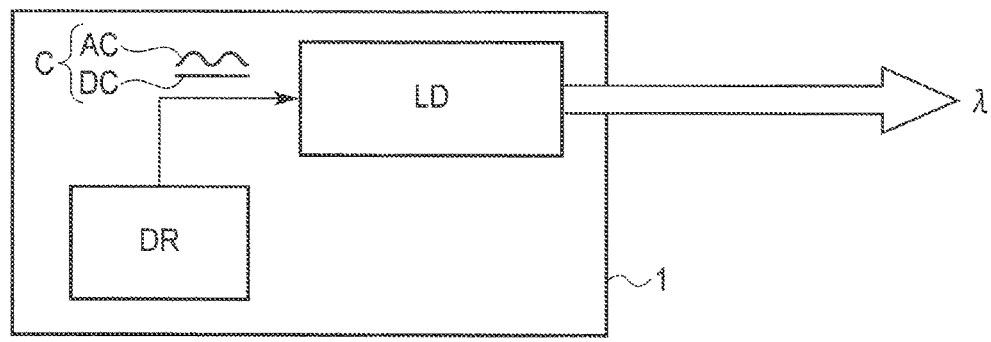
FIG. 1 is a diagram showing an example of the structure of a semiconductor laser 1 according to the present embodiment.

In general, according to one embodiment, a semiconductor laser includes a semiconductor laser element. A drive current which is composed of a direct current and an alternating current superposed thereon is applied to the semiconductor laser element. A waveform of the alternating current is a non-square wave. A frequency of the alternating current is from 50 Hz to 500 kHz.

According to another embodiment, a semiconductor laser set includes the semiconductor lasers. The semiconductor lasers emit light having substantially same type colors (similar colors) and having different dominant emission wavelengths.

According to yet another embodiment, a semiconductor laser set includes a first semiconductor laser, and a second semiconductor laser. Each of the first semiconductor laser and the second semiconductor laser is the semiconductor laser. A dominant emission wavelength of the first semiconductor laser is greater than or equal to 450 nm and less than or equal to 480 nm. A dominant emission wavelength of the second semiconductor laser is greater than or equal to 525 nm and less than or equal to 550 nm. A wavelength difference between the dominant emission wavelength of the first semiconductor laser and the dominant emission wavelength of the second semiconductor laser is greater than or equal to 65 nm and less than or equal to 95 nm.

According to yet another embodiment, a display device includes the semiconductor laser set, and a color filter having a maximum transmittance at a wavelength of greater than or equal to 450 nm and less than or equal to 480 nm. The color filter has a maximum transmittance at a first wavelength, a transmittance of 10% at a second wavelength which is shorter than the first wavelength, and a transmittance of 10% at a third wavelength which is longer than the first wavelength. B/A is less than or equal to 0.75 where A is a wavelength difference between the first wavelength and the second wavelength and B is a wavelength difference between the first wavelength and the third wavelength.

According to yet another embodiment, a semiconductor laser set comprising first semiconductor lasers which emit light having substantially same type colors (similar colors) and having different dominant emission wavelengths, or comprising second semiconductor lasers which emit light having substantially same type colors (similar colors) with a second color different from the first color and having different dominant emission wavelengths.

According to the above-described structures, a semiconductor laser, a semiconductor laser set and a display device which can reduce speckle noise can be obtained.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the specification, expressions such as "α includes A, B or C", "α includes any one of A, B and C" and "α includes one selected from a group consisting of A, B and C" do not exclude a case where α includes various combinations of A, B and C unless otherwise specified. Further, these expressions do not exclude a case where α includes other elements.

In the specification, "the first, the second and the third" in an expression such as "the first α, the second α and the third α" merely represent numbers used for the sake of convenience of explaining elements. That is, an expression such as "A includes the third α" also includes a case where A does not include the first α and the second α unless otherwise specified.

FIG. 1 is a diagram showing an example of the structure of a semiconductor laser 1 according to the present embodiment. The semiconductor laser 1 includes a semiconductor laser element LD and a driver DR.

The semiconductor laser element LD emits light having an emission main wavelength λ within a visible light wavelength range. For example, the visible light wavelength range is a wavelength range of 380 nm to 780 nm. The semiconductor laser element LD is a blue laser element which emits light having a blue-based color, a green laser element which emits light having a green-based color or a red laser element which emits light having a red-based color. These will be described later in detail. The semiconductor laser element LD may emit light in the visible light wavelength range by itself or may emit light in the visible light wavelength range by converting light in the range of the wavelength of infrared light or far-infrared light by using a technique such as the second harmonic generation or the third harmonic generation. Further, the semiconductor laser element LD may be a refractive-index-guided semiconductor laser or a gain-guided laser semiconductor laser.

The driver DR controls a drive current applied to the semiconductor laser element LD. For example, the driver DR applies a drive current C composed of a direct current DC and an alternating current AC superposed thereon, to the semiconductor laser element LD. The waveform of the alternating current AC is a non-square wave such as a sine wave or a triangle wave having a continuously-variable current value. As will be described later, the frequency of the alternating current AC is from 50 Hz to 500 kHz. In the semiconductor laser 1 of the present embodiment, as the applied drive current C increases, the laser output increases and the emission wavelength range shifts to the long-wavelength side.

Figure 2:
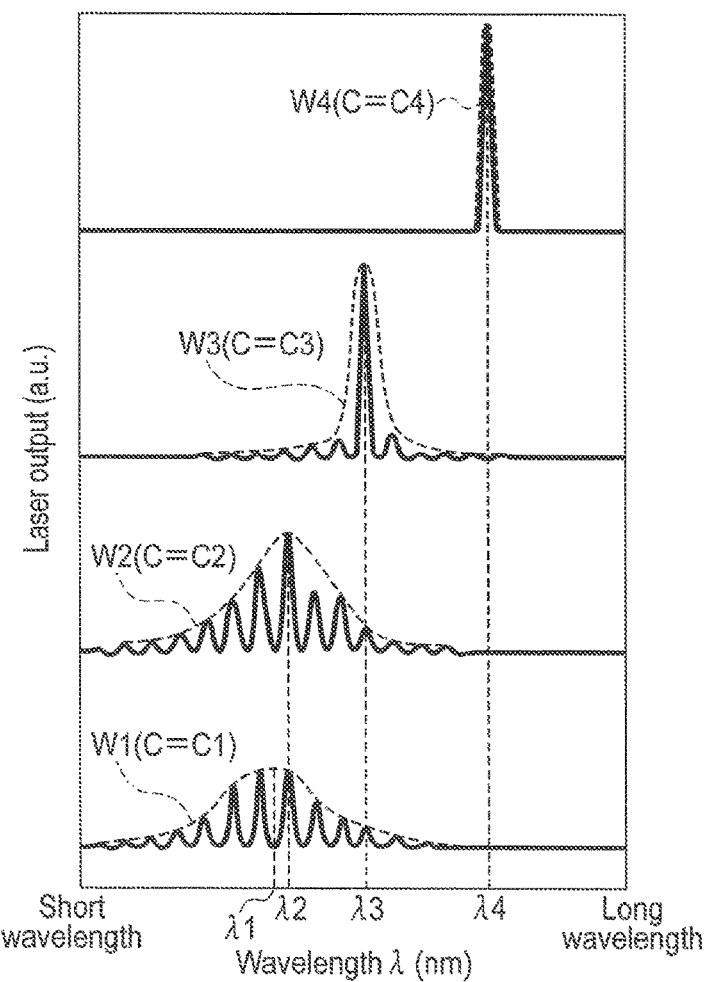
FIG. 2 is a diagram showing an example of the relationship of a drive current to a laser output and an emission wavelength range in the semiconductor laser 1 shown in FIG. 1.

FIG. 2 is a diagram showing an example of the relationship of the drive current to the laser output and the emission wavelength range in the semiconductor laser 1 shown in FIG. 1. In the drawing, the horizontal axis indicates a wavelength (nm) and the vertical axis indicates a laser output. The example illustrated relates to the semiconductor laser 1 including a refractive-index-guided semiconductor laser element. W1 in the drawing indicates an emission wavelength range of the semiconductor laser 1 when a first drive current C1 is applied. Similarly, W2, W3 and W4 in the drawing indicate emission wavelength ranges, respectively. A second drive current C2 which produces the emission wavelength range W2 is higher than the first drive current C1, a third drive current C3 which produces the emission wavelength range W3 is higher than the second drive current C2, and a fourth drive current C4 which produces the fourth emission wavelength range W4 is higher than the third drive current C3. In the drawing, λ1 indicates the dominant emission wavelength of the emission wavelength range W1. Similarly, λ2, λ3 and λ4 in the drawing indicate the dominant emission wavelengths, respectively. The dominant emission wavelength corresponds to a wavelength in the emission wavelength range in which the laser output is a maximum (or can be regarded as a maximum).

As shown in the drawing, as the drive current C increases from the first drive current C1 to the fourth drive current C4, the emission wavelength range shifts to the long-wavelength side from the emission wavelength range W1 to the emission wavelength range W4. Further, as the drive current C increases from the first drive current C1 to the fourth drive current C4, the laser output at the dominant emission wavelength increases, accordingly. When the drive current C decreases from the fourth drive current C4 to the first drive current C1, the emission wavelength range shifts to the short-wavelength side, and the laser output changes in a direction in which the laser output decreases. Since the drive current C of the present embodiment includes the alternating current AC having a continuously-variable current value, the emission wavelength range and the laser output will change in terms of time as shown in the drawing.

Figure 3:
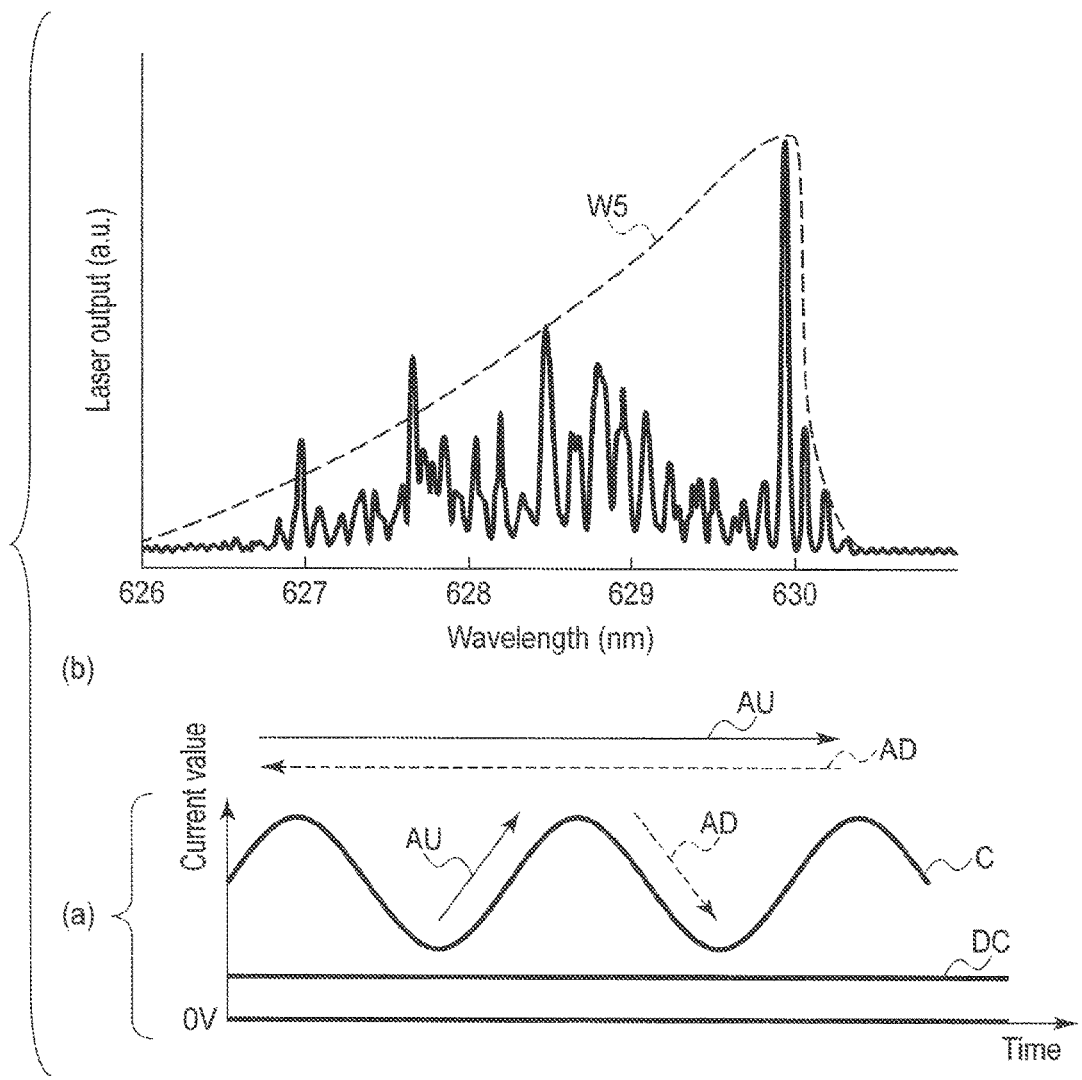
FIG. 3 is a diagram showing an example of the relationship between the driver current applied to the semiconductor laser 1 shown in FIG. 1 and the laser output.

FIG. 3 (a) is a diagram showing an example of the drive current C applied to the semiconductor laser element LD shown in FIG. 1. In the drawing, the horizontal axis indicates time, and the vertical axis indicates a current value. The direct current DC is set to a current value greater than a threshold value at which the semiconductor laser element LD performs laser oscillation. The drive current C is a current composed of the direct current DC which is shown in the drawing and an alternating current which is not shown in the drawing and is superposed on the direct current DC. The drive current C increases as shown by an arrow AU in the drawing and decreases as shown by an arrow AD in the drawing.

FIG. 3 (b) is a diagram showing an example of the laser output and the emission wavelength range of the semiconductor laser element LD which is subjected to the drive current C shown in FIG. 3 (a). In the drawing, the horizontal axis indicates a wavelength and the vertical axis indicates a laser output. Note that the wavelength in the horizontal axis is presented by way of example only and the wavelength is not limited to this example. The example illustrated shows a time-averaged emission wavelength range W5 when the semiconductor laser element LD is a red laser element. That is, if the drive current C increases as shown by the arrow AU, the emission wavelength range and the dominant emission wavelength shift from the short-wavelength side to the long-wavelength side, and the laser output gradually increases. On the other hand, if the drive current C decreases as shown by the arrow AD, the emission wavelength range and the dominant emission wavelength shift from the long-wavelength side to the short-wavelength side, and the laser output gradually decreases. Therefore, as a time-averaged emission wavelength range, the emission wavelength range W5 shown in the drawing will be obtained.

Therefore, as compared to the case of applying the drive current C which only includes the direct current DC to the semiconductor laser element LD, according to the present embodiment which applies the drive current C which is composed of the direct current DC and the alternating current AC superposed thereon to the semiconductor laser element LD, the expanded, time-averaged emission wavelength range W5 can be obtained. In particular, since the drive current C includes the alternating current AC having a low frequency of less than or equal to 500 kHz, responsiveness of the changes of the emission wavelength range and the laser output in association with the change in the current voltage which have been described with reference to FIG. 2 improves in the semiconductor laser element LD. Therefore, as compared to the case of applying the drive current C which includes the alternating current AC having a high frequency of greater than 500 kHz, according to the present embodiment, the equally-expanded or more-expanded, emission wavelength range W5 can be obtained. As the emission wavelength range is expanded, the coherence length of the semiconductor laser 1 can be reduced, and consequently speckle noise can be reduced.

Figure 4:
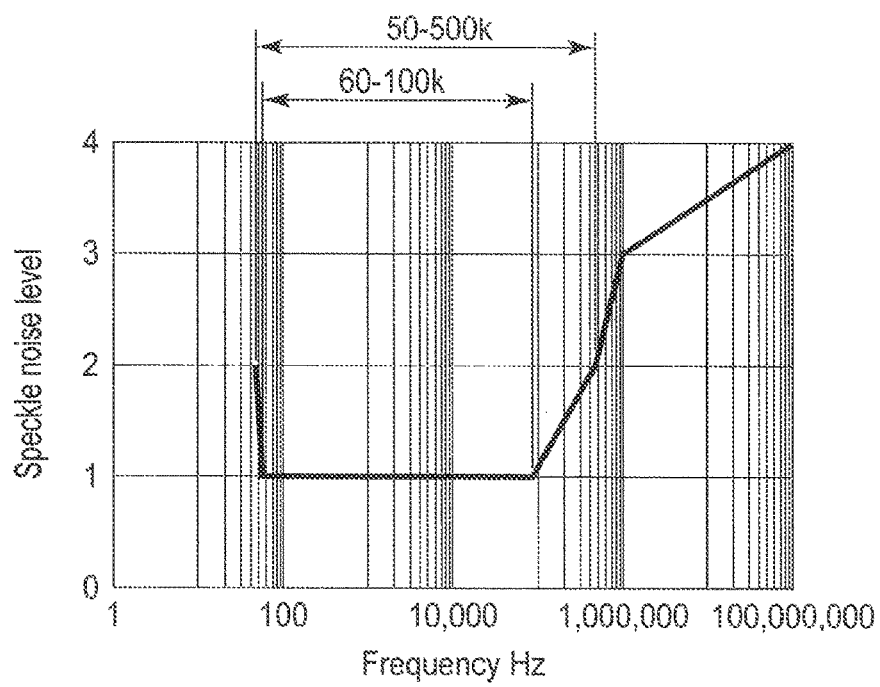
FIG. 4 is a diagram showing a result of an experiment for examining the frequency dependence of speckle noise.

FIG. 4 is a diagram showing a result of an experiment for examining the frequency dependence of speckle noise. In the drawing, the horizontal axis indicates the frequency of the alternating current AC in the drive current C, and the vertical axis indicates the level of speckle noise.

Here, light was emitted from the semiconductor laser element LD and projected on a screen, and the pattern of the projected light was observed by a plurality of research participants, and then speckle noise was ranked based on the number of the research participants who recognized the speckle noise. The alternating current AC was changed in a range of 50 Hz to 100 MHz. The number of the research participants was 10. Speckle noise was divided into four levels, that is, level 1 to level 4. Level 1 corresponds to a case where none of the research participants recognized speckle noise. Level 2 corresponds to a case where less than half (less than or equal to four) of the research participants recognized speckle noise. Level 3 corresponds to a case where greater than or equal to half (greater than or equal to five) of the research participants recognized speckle noise. Level 4 corresponds to a case where all the research participants recognized speckle noise.

According to the experiment result shown in the drawing, it was found that speckle noise can be reduced to an unnoticeable level when the frequency of the alternating current AC is in a range of 50 Hz to 500 kHz. Further, it was found that speckle noise can be reduced to an unrecognizable level to all the research participants when the frequency of the alternating current AC is in a range of 60 Hz to 100 kHz. Based on the above experiment result, in the present embodiment, the frequency of the alternating current AC is set to the range of 50 Hz to 500 kHz, more preferably, the range of 60 Hz to 100 kHz. In the following, the driving of the semiconductor laser element LD by the drive current C including the alternating current AC in the above frequency range will be referred to as low-frequency driving, and the driving of the semiconductor laser element LD by the drive current including the direct current only will be referred to as DC driving.

Figure 5:
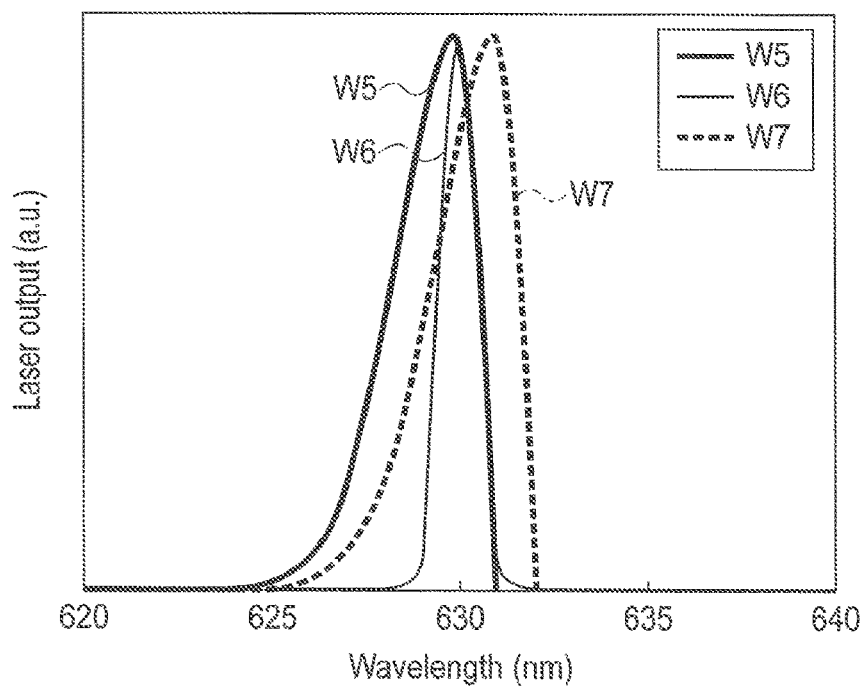
FIG. 5 is a diagram showing an example of the emission wavelength ranges by low-frequency driving and DC driving.

FIG. 5 is a diagram showing an example of the emission wavelength ranges by the low-frequency driving and the DC driving. In the drawing, the horizontal axis indicates a wavelength and the vertical axis indicates a laser output. Note that the wavelength in the horizontal axis is presented by way of example only and the wavelength is not limited to this example. The example illustrated shows a time-averaged emission wavelength range when the semiconductor laser element LD is a red laser element. The emission wavelength range W5 is obtained by the low-frequency driving. An emission wavelength range W6 is obtained by the DC driving. Both of the emission wavelength ranges W5 and W6 have a dominant emission wavelength of 630 nm.

Comparing the emission wavelength range W5 to the emission wavelength range W6, the wavelength difference between the shortest wavelength and the longest wavelength of the emission wavelength range W5 is greater than that of the emission wavelength range W6. In the example illustrated, in the emission wavelength range W6, the shortest wavelength is 628 nm, the longest wavelength is 632 nm, and the wavelength difference is 4 nm. In the emission wavelength range W5, the shortest wavelength is 624 nm, the longest wavelength 631 nm, and the wavelength difference is 7 nm. That is, the emission wavelength range can be expanded in the case of the low-frequency driving as compared to the case of the DC driving.

In the emission wavelength range W6, the wavelength difference between the dominant emission wavelength and the shortest wavelength is equal to the wavelength difference between the dominant emission wavelength and the longest wavelength, and is 2 nm, for example, in the example illustrated. That is, the short-wavelength side and the long-wavelength side of the emission wavelength range W6 are symmetrical to the dominant emission wavelength. Therefore, the light of the emission wavelength range W6 is regarded as light having the color of the dominant emission wavelength. In the emission wavelength range W5, the wavelength difference between the dominant emission wavelength and the shortest wavelength is greater than the wavelength difference between the dominant emission wavelength and the longest wavelength. In the example illustrated, the former wavelength difference is 6 nm, and the latter wavelength difference is 1 nm. That is, the short-wavelength side and the long-wavelength side of the emission wavelength range W5 are asymmetrical to the dominant emission wavelength, and the emission wavelength range W5 is expanded to the short-wavelength side. Therefore, the visible light of the emission wavelength range W5 is regarded as light having a wavelength shifted from the dominant emission wavelength to the short-wavelength side. It means that the emission wavelength ranges W5 and W6 have the same dominant emission wavelength but have different color chromaticities. An emission wavelength range W7 shown by a dotted line in the drawing corresponds to the shifted emission wavelength range W5 which is shifted to the long-wavelength side. For example, the dominant wavelength range of the emission wavelength range W7 is 631 nm.

Even when the semiconductor laser element LD is a blue laser element or a green laser element, the emission wavelength ranges by the low-frequency driving and the DC driving will have the same tendencies as those of the example illustrated, respectively.

Next, the relationship between the color gamut of BT.2020 which defines the video format of ultra-high-definition televisions, and the dominant emission wavelength of the semiconductor laser element LD will be described with reference to a CIE 1931 xy chromaticity diagram.

FIG. 6 is a chromaticity diagram showing a target color gamut. Chromaticity coordinates in the diagram are expressed as (x, y). A color gamut which BT.2020 defines is defined by three primary colors (red, green and blue) shown in the chromaticity diagram, and the wavelengths of red, green and blue are 630 nm, 532 nm and 467 nm, respectively. That is, a point R1 corresponds to the red wavelength of 630 nm, and chromaticity coordinates are (x, y)=(0.708, 0.292). A point G1 corresponds to the green wavelength of 532 nm, and chromaticity coordinates are (x, y)=(0.170, 0.797). A point B1 corresponds to the blue wavelength of 467 nm, and chromaticity coordinates are (x, y)=(0.131, 0.046). A triangle having vertices corresponding to the points R1, G1 and B1 corresponds to the color gamut of BT.2020 and is assumed to be the target color gamut. To realize this target color gamut, light sources having the points R1, G1 and B1 as dominant emission wavelengths are required.

FIG. 7 is an enlarged view of a red region including the point R1 of the chromaticity diagram shown in FIG. 6. When a red laser element is driven as the semiconductor laser element LD by the DC driving, red light r1 is emitted. The dominant emission wavelength of the red light r1 is 630 nm, and the emission wavelength range is the emission wavelength range W6 shown in FIG. 5, for example. The point R1 corresponds to the chromaticity coordinates of the red light r1. When a red laser element is driven as the semiconductor laser element LD by the low-frequency driving, red light r2 is emitted. The frequency is 100 Hz, for example. The dominant emission wavelength of the red light r2 is 630 nm, and the emission wavelength range is the emission wavelength range W5 shown in FIG. 5, for example. A point R2 corresponds to the chromaticity coordinates of red light r2. As shown in the drawing, the point R1 and the point R2 do not coincide with each other. The reason for this is just as described with reference to FIG. 5. Therefore, when the red light r2 is emitted, the target color gamut cannot be fully realized.

For this reason, when a red laser element is driven by the low-frequency driving, the emission wavelength range is shifted to the long-wavelength side. In this case, red light r3 to be emitted has an emission wavelength range shifted to the long-wavelength side from that of the red light r2. The dominant wavelength range of the red light r3 is 631 nm, and the emission wavelength range is the emission wavelength range W7 shown in FIG. 5, for example. The chromaticity coordinates of the red light r3 substantially correspond to the point R1. Although the red wavelength to realize the target color gamut shown in FIG. 6 is 630 nm, in the case of applying the low-frequency driving, the dominant emission wavelength needs to be on the long-wavelength side from the wavelength of 630 nm. For example, the dominant emission wavelength should preferably be greater than 630 nm and less than or equal to 655 nm.

Figure 8:
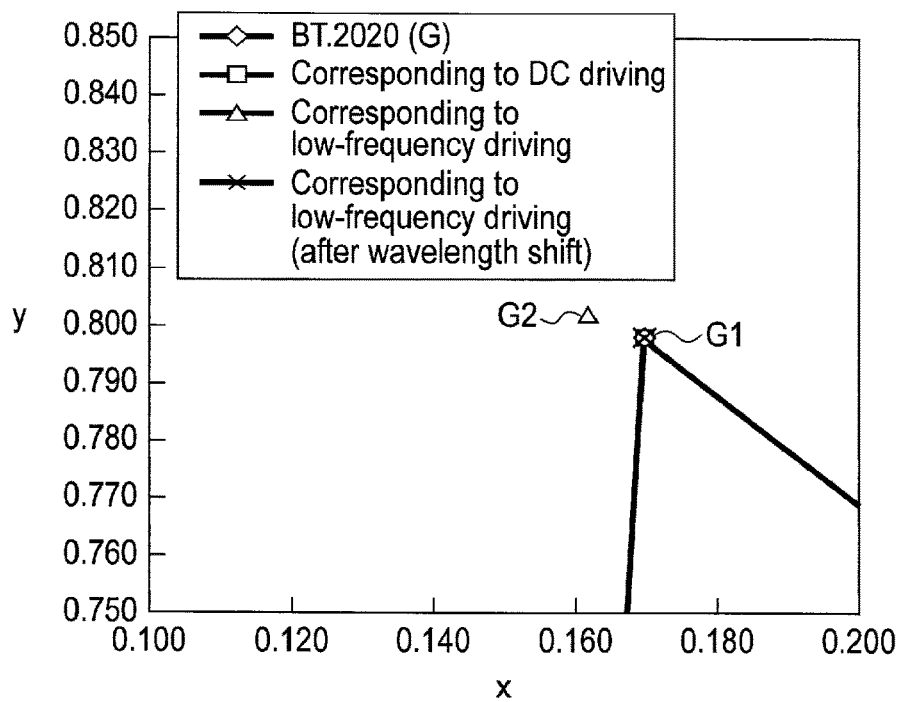
FIG. 8 is an enlarged view of a green region including a point G1 in the chromaticity diagram shown in FIG. 6.

FIG. 8 is an enlarged view of a green region including the point G1 of the chromaticity diagram shown in FIG. 6. The case of applying a green laser element as the semiconductor laser element LD is also the same as the case of applying a red laser element as the semiconductor laser element LD. That is, the dominant emission wavelength of green light g1 in the DC driving is 532 nm, and the point G1 corresponds to the chromaticity coordinates of the green light g1. The dominant emission wavelength of green light g2 in the low-frequency driving is 532 nm, but a point G2 corresponding to the chromaticity coordinates does not coincide with the point G1. The dominant emission wavelength of green light g3 is 533 nm, and the chromaticity coordinates substantially correspond to the point G1. In the case of applying the low-frequency driving, the dominant emission wavelength needs to be on the long-wavelength side from the wavelength of 532 nm, and for example, the dominant emission wavelength should preferably be greater than 532 nm and less than or equal to 555 nm.

Figure 9:
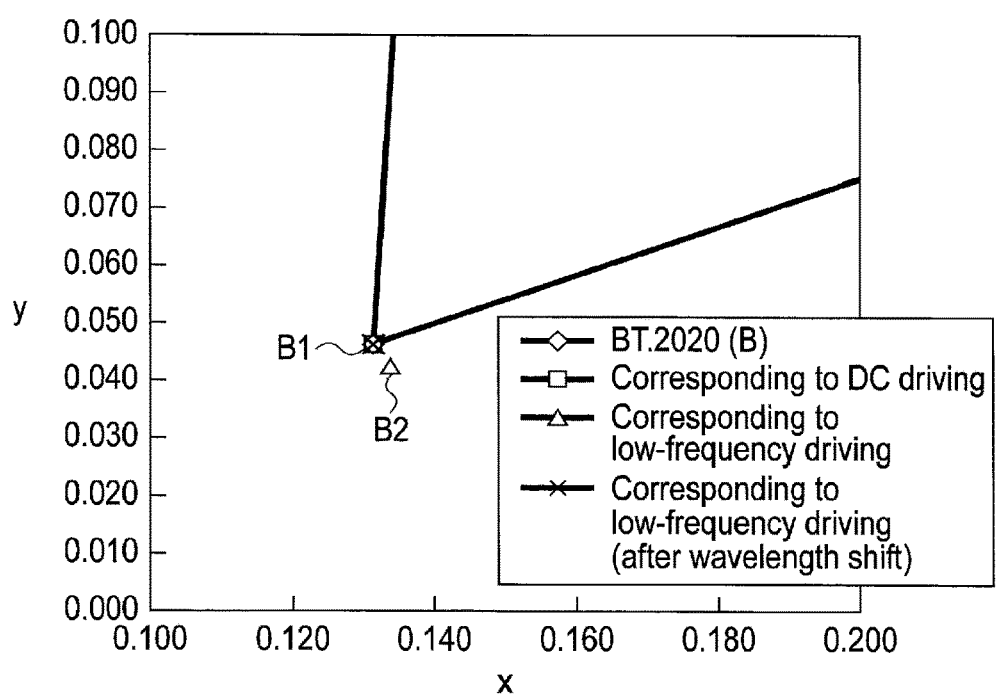
FIG. 9 is an enlarged view of a blue region including a point B1 in the chromaticity diagram shown in FIG. 6.

FIG. 9 is an enlarged view of a blue region including the point B1 of the chromaticity diagram shown in FIG. 6. The case of applying a blue laser element as the semiconductor laser element LD is also the same as the case of applying a red laser element as the semiconductor laser element LD. That is, the dominant emission wavelength of blue light b1 in the DC driving is 467 nm, and the point B1 corresponds to the chromaticity coordinates of the blue light b1. The dominant emission wavelength of blue light b2 in the low-frequency driving is 467 nm, and a point B2 corresponding to the chromaticity coordinates does not coincide with the point B1. The dominant emission wavelength of blue light b3 is 468 nm, and the chromaticity coordinates substantially correspond to the point B1. In the case of applying the low-frequency driving, the dominant emission wavelength needs to be on the long-wavelength side from the wavelength of 467 nm, and for example, the dominant emission wavelength should preferably be greater than 467 nm and less than or equal to 485 nm.

As described above, when the low-frequency driving is applied for the purpose of reducing speckle noise, if the emission wavelength range is shifted to the long-wavelength side or if the dominant emission wavelength is shifted to the long-wavelength side from the target wavelength, light sources having the points R1, C1 and B1 as dominant emission wavelengths can be provided. Therefore, the target color gamut can be fully realized.

FIG. 10 is a diagram showing an example of the structure of a semiconductor laser set 2 according to the present embodiment. The semiconductor laser set 2 includes the semiconductor lasers 1 shown in FIG. 1. The semiconductor lasers 1 emit light having substantially same type colors and have different dominant emission wavelengths. In the example illustrated, a semiconductor laser element LD1 emits light having a dominant emission wavelength λ, and a semiconductor laser element LD2 emits light having a dominant emission wavelength λ±Δλ, where Δλ is less than or equal to 30 nm, for example.

For example, in the first structural example in which the semiconductor laser elements LD1 and LD2 are red laser elements, the dominant emission wavelengths λ and λ±Δλ are greater than or equal to 600 nm and less than or equal to 650 nm. The red laser element is formed of an aluminum-gallium-indium (AlGaInP)-based semiconductor material or a GaInP-based semiconductor material, for example. In the second structural example in which the semiconductor laser elements LD1 and LD2 are green laser elements, the dominant emission wavelengths λ and λ±Δλ are greater than or equal to 525 nm and less than or equal to 550 nm. The green laser element is formed of an indium-gallium-nitride (In-GaN)-based semiconductor material or a zinc selenide (ZnSe)-based semiconductor material. In the third structural example in which the semiconductor laser elements LD1 and LD2 are blue laser elements, the dominant emission wavelengths $\lambda$ and $\lambda \pm \Delta\lambda$ are greater than or equal to 450 nm and less than or equal to 480 nm. The blue laser element is formed of a gallium-nitride (GaN)-based semiconductor material or an InGaN-based semiconductor material. The compound ratio of indium in a crystal of the InGaN-based semiconductor material which forms the blue laser element is less than that of the InGaN-based semiconductor material which forms the green laser element. Drivers DR1 and DR2 of the semiconductor lasers 1 may be integrated with each other. Further, the semiconductor laser set 2 may include three or more semiconductor lasers 1.

FIG. 11 is a diagram showing an example of the emission wavelength range in the first structural example of the semiconductor laser set 2. FIG. 12 is a diagram showing an example of the emission wavelength range in the second structural example of the semiconductor laser set 2. FIG. 13 is a diagram showing an example of the emission wavelength range in the third structural example of the semiconductor laser set 2. In FIGS. 11 to 13, the horizontal axis indicates a wavelength, and the vertical axis indicates a laser output. Note that the wavelength of the horizontal axis is presented by way of example only. The following description will be based on the assumption that the semiconductor laser elements LD1 and LD2 are driven by the low-frequency driving in all the semiconductor laser sets 2 of the first to third structural examples.

As shown in FIG. 11, emission wavelength ranges WR1 and WR2 of the semiconductor laser elements LD1 and LD2 partially overlap each other. In the example illustrated, the emission wavelength range WR1 extends from about 624 nm to about 631 nm. The emission wavelength range WR2 extends from about 626 nm to about 633 nm. An emission wavelength range WR12 of the semiconductor laser set 2 is equal to the combination of the emission wavelength ranges WR1 and WR2. The emission wavelength range WR12 extends from about 624 nm to about 633 nm. The emission wavelength range WR12 has two maximums, and the wavelengths of the maximums are substantially equal to the dominant emission wavelengths of the semiconductor laser elements LD1 and LD2, respectively. The dominant emission wavelength of the semiconductor laser element LD1 is 630 nm, and the dominant emission wavelength of the semiconductor laser element LD2 is 632 nm. In the emission wavelength range WR12, as compared to the emission wavelength ranges WR1 and WR2, the laser output at the wavelength of 630 nm increases, and the laser output on the long-wavelength side from the wavelength of 630 nm increases. Accordingly, the semiconductor laser set 2 corresponding to a red light source in which a dominant emission wavelength is 630 nm and an emission wavelength range is expanded such that speckle noise is reduced can be provided.

Also in FIG. 12, emission wavelength ranges WG1 and WG2 partially overlap each other. In the example illustrated, the emission wavelength range WG1 extends from about 526 nm to about 533 nm, and the emission wavelength range WG2 extends from about 528 nm to about 535 nm. An emission wavelength range WG12 extends from about 526 nm to about 535 nm. The wavelengths of two maximums in the emission wavelength range WG12 are substantially equal to a dominant emission wavelength of 532 nm of the semiconductor laser element LD1 and a dominant emission wavelength of 534 nm of the semiconductor laser element LD2. In the emission wavelength range WG12, as compared to the emission wavelength ranges WG1 and WG2, the laser output at the wavelength of 532 nm increases, and the laser output on the long-wavelength side from the wavelength of 532 nm increases. Accordingly, the semiconductor laser set 2 corresponding to a green light source in which a dominant emission wavelength is 532 nm and an emission wavelength range is expanded such that speckle noise is reduced can be provided.

Also in FIG. 13, emission wavelength ranges WB1 and WB2 partially overlap each other. In the example illustrated, the emission wavelength range WB1 extends from about 461 nm to about 468 nm, and the emission wavelength range WB2 extends from about 463 nm to about 470 nm. An emission wavelength range WB12 extends from about 461 nm to about 470 nm. The wavelengths of two maximums in the emission wavelength range WB12 are substantially equal to a dominant emission wavelength of 467 nm of the semiconductor laser element LD1 and a dominant emission wavelength of 469 nm of the semiconductor laser element LD2. In the emission wavelength range WB12, as compared to the emission wavelength ranges WB1 and WB2, the laser output at the wavelength of 467 nm increases, and the laser output on the long-wavelength side from the wavelength of 467 nm increases. Accordingly, the semiconductor laser set 2 corresponding to a blue light source in which a dominant emission wavelength is 467 nm and an emission wavelength range is expanded such that speckle noise is reduced can be provided.

FIG. 14 is a diagram showing an example of the structure of a semiconductor laser set 3 according to the present embodiment. The semiconductor laser set 3 includes a first semiconductor laser 1b and a second semiconductor laser 1g. The first semiconductor laser 1b and the second semiconductor laser 1g have the same structure as that of the semiconductor laser 1 shown in FIG. 1. However, the first semiconductor laser 1b and the semiconductor laser 1g emit light having non-substantially same type colors (non-similar colors). The first semiconductor laser 1b corresponds to a blue light source, and the second semiconductor laser 1g corresponds to a green light source. A semiconductor laser element LDb is a blue laser element, and its dominant emission wavelength $\lambda$b is greater than or equal to 450 nm and less than or equal to 480 nm. A semiconductor laser element LDg is a green laser element, and its dominant emission wavelength $\lambda$g is greater than or equal to 525 nm and less than or equal to 550 nm. The wavelength difference between the dominant emission wavelength $\lambda$g and the dominant emission wavelength $\lambda$b is greater than or equal to 65 nm and less than or equal to 95 nm. Drivers DRb and DRg in the semiconductor laser set 3 may be integrated with each other. Further, the semiconductor laser set 3 may include a third semiconductor laser 1r which is a red light source, in place of the first semiconductor laser 1b or the second semiconductor laser 1g.

FIG. 15 is a diagram showing an example of the structure of a semiconductor laser set 4 according to the present embodiment. The semiconductor laser set 4 includes the first semiconductor laser 1b, the second semiconductor laser 1g and the third semiconductor laser 1r. The first to third semiconductor lasers 1b, 1g and 1r have the same structure as that of the semiconductor laser 1 shown in FIG. 1 and emit light having non-substantially same type colors (non-similar colors). A semiconductor laser element LDr is a red laser element, and its dominant emission wavelength $\lambda$r is greater than or equal to 600 nm and less than or equal to 650 nm. Drivers DRb, DRg and DRr may be integrated with each other.

FIG. 16 is a diagram showing an example of the structure of a semiconductor laser set 5 according to the present embodiment. The semiconductor laser set 5 includes the first semiconductor lasers 1b, the second semiconductor lasers 1g and the third semiconductor lasers 1r. The semiconductor lasers 1b emit light having substantially same type colors with blue (the first color) and have different dominant emission wavelengths. A semiconductor laser element LDb1 emits light having a dominant emission wavelength $\lambda b$, and a semiconductor laser element LDb2 emits light having a dominant emission wavelength $\lambda b \pm \Delta \lambda b$. The semiconductor lasers 1g emit light having substantially same type colors with green (the second color) and have different dominant emission wavelengths. A semiconductor laser element LDg1 emits light having a dominant emission wavelength $\lambda g$, and a semiconductor laser element LDg2 emits light having a dominant emission wavelength $\lambda g \pm \Delta \lambda g$. The semiconductor lasers 1r emit light having substantially same type colors with red (the third color) and have different dominant emission wavelengths. A semiconductor laser element LDr1 emits light having a dominant emission wavelength $\lambda r$, and a semiconductor laser element LDr2 emits light having a dominant emission wavelength $\lambda r \pm \Delta \lambda r$.

Next, in consideration a system in which light emitted from a semiconductor laser element is transmitted through a color filter, the relationship between an emission wavelength range and a spectral transmittance will be examined.

FIG. 17 is a diagram showing the relationship between the emission wavelength ranges of semiconductor laser elements and the spectral transmittances of color filters. The horizontal axis in the drawing indicates a wavelength, the left vertical axis in the drawing indicates a transmittance and the right vertical axis in the drawing indicates a laser output. The drawing shows emission wavelength ranges Wb, Wg and Wr of the semiconductor laser elements LDb, LDg and LDr shown in FIG. 15 and spectral transmittances of a red color filter R-CF, a green color filter G-CF and a blue color filter B-CF. As a preferable mode, it is preferable that the blue color filter B-CF should only transmit blue light from the semiconductor laser element LDb, the green color filter G-CF should only transmit green light from the semiconductor laser element LDg, and the red color filter R-CF should only transmit red light from the semiconductor laser element LDr. In particular, the difference between the green wavelength and the blue wavelength which is required for BT.2020 is less than the difference between the green wavelength and the red wavelength. Therefore, the wavelength at which the blue color filter B-CF has the spectral transmittance should preferably not spread to the green wavelength. Similarly, the wavelength at which the green color filter G-CF has the spectral transmittance should preferably not spread to the blue wavelength.

When focusing on the blue color filter B-CF, the blue color filter B-CF has a maximum transmittance at the first wavelength of greater than or equal to 440 nm and less than or equal to 460 nm. Assuming that the blue color filter B-CF has a transmittance of 10% at the second wavelength on the short-wavelength side from the first wavelength and has a transmittance of 10% at the third wavelength on the long-wavelength side from the first wavelength, the wavelength range from the first wavelength to the third wavelength is smaller than the wavelength range from the first wavelength to the second wavelength. Alternatively, assuming that the difference between the first wavelength and the second wavelength is A and the difference between the first wavelength and the third wavelength is B, B/A is less than or equal to 0.75. For example, the first wavelength is 450 nm, the second wavelength is 355 nm, the third wavelength is 505 nm, the value of A is 95 nm, the value of B is 55 nm, and the value of B/A is 0.58. Accordingly, leakage of green light from the blue color filter B-CF can be suppressed. The same also applies to the other color filters. Therefore, deviation from the target color gamut can be suppressed.

Next, a display device including the above-described semiconductor laser or semiconductor laser set will be described.

Figure 18:
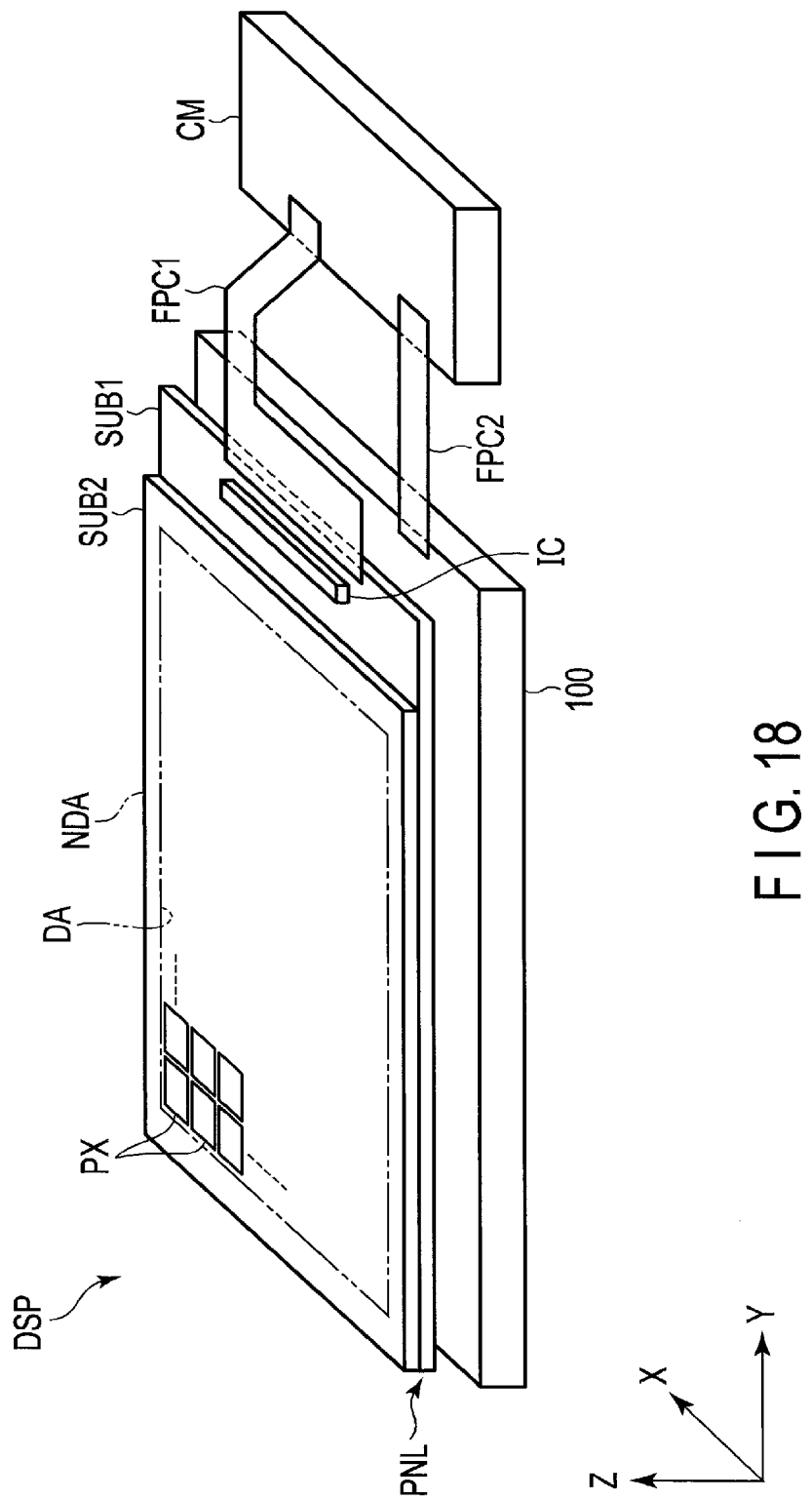
FIG. 18 is a diagram showing a display device DSP according to the present embodiment.

FIG. 18 is a perspective view of a display device DSP according to the present embodiment. The display device DSP includes a display panel PNL, a driver IC chip IC which drives the display panel PNL, an illumination device 100 which illuminates the display panel PNL, a control module CM which controls the operations of the display panel PNL and the illumination device 100, flexible printed circuits FPC1 and FPC2 which transmit control signals to the display panel PNL and the illumination device 100, etc. In the present embodiment, a first direction X is the short-side direction of the display panel PNL, for example. A second direction Y is a direction intersecting the first direction X and is the long-side direction of the display panel PNL. Further, a third direction Z is a direction intersecting the first direction X and the second direction Y, and a direction of the pointing end of an arrow indicating the third direction Z is referred to as "above" and a direction opposite to the direction of the pointing end of the arrow is referred to as "below". Expressions such as "the second member above the first member" and "the second member below the first member" mean that the second member may be in contact with the first member and may be away from the first member.

The display panel PNL includes a first substrate SUB1, a second substrate SUB2 which is opposed to the first substrate SUB1, and a liquid crystal layer LQ which will be described later. The display panel PNL includes a display area DA which displays an image and a non-display area NDA which is located around the display area DA. The display panel PNL includes pixels PX arranged in a matrix in the first direction X and the second direction Y within the display area DA, for example.

The illumination device 100 is arranged below the first substrate SUB1 of the display panel PNL and is opposed to the first substrate SUB1 of the display panel PNL. The illumination device 100 corresponds to the so-called backlight unit which illuminates the display panel PNL from the back surface side.

The driver IC chip IC is mounted on the first substrate SUB1 of the display panel PNL. The flexible printed circuit FPC1 is mounted on the first substrate SUB1 and connects the display panel PNL and the control module CM. The flexible printed circuit FPC2 connects the illumination device 100 and the control module CM.

The display device DSP having such a structure displays an image by transmitting light coming from the illumination device 100 and entering the display panel PNL selectively through the pixels PX.

Figure 19:
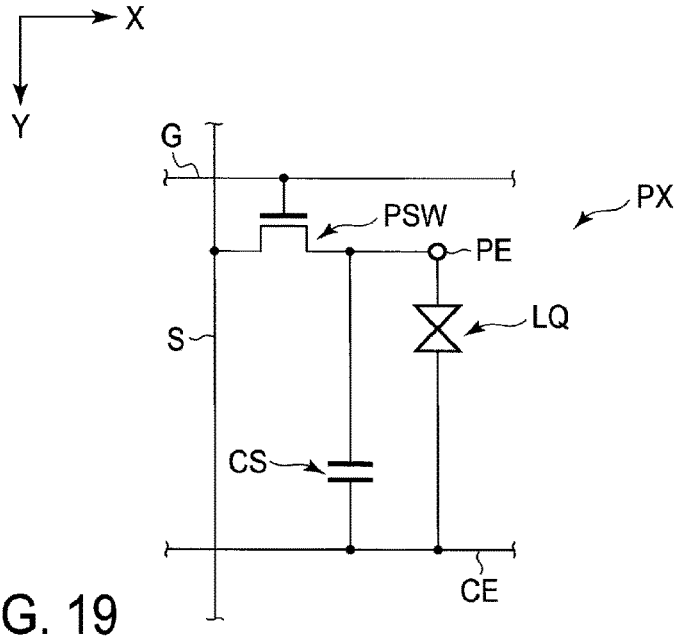
FIG. 19 is a diagram showing the structure of a pixel PX shown in FIG. 18.

FIG. 19 is a diagram showing the structure of the pixel PX. The pixel PX includes a switching element PSW, a pixel electrode PE, a common electrode CE, a liquid crystal layer LQ, etc. The switching element PSW is formed of a thin-film transistor (TFT), for example. The switching element PSW is electrically connected to a scanning line G, a signal line S and the pixel electrode PE. For example, the scanning line G is elongated in the first direction X, and the signal line is elongated in the second direction Y. The scanning line G and the signal line S may be linearly formed or may be at least partially winding. The liquid crystal layer LQ is driven by an electric field generated between the pixel electrode PE and the common electrode CE. Storage capacitance CS is electric capacitance formed between the common electrode CE and the pixel electrode PE.

Figure 20:
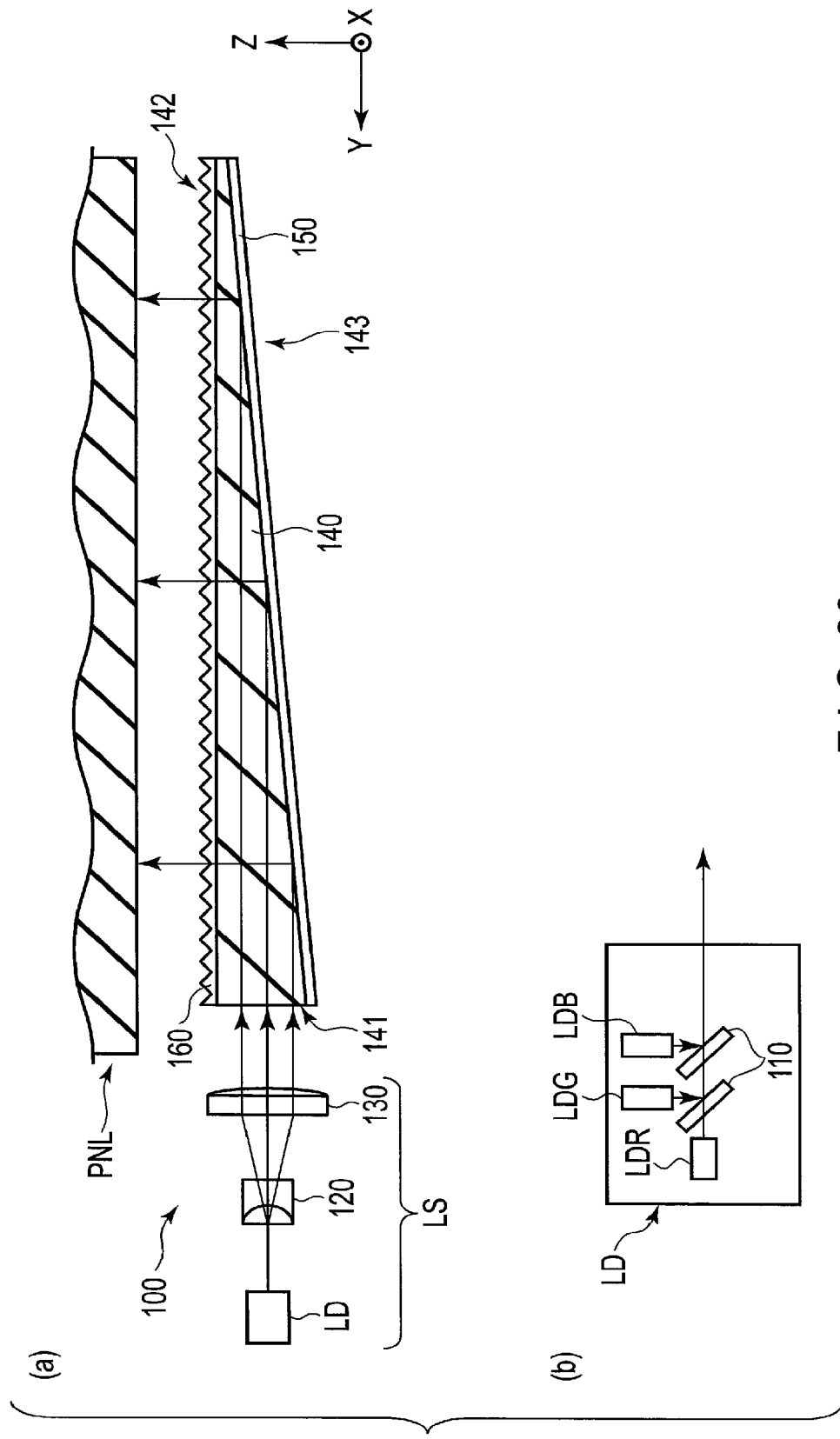
FIG. 20 is a diagram showing an illumination device 100 shown in FIG. 18.

FIG. 20 is a diagram showing the illumination device 100 shown in FIG. 18. FIG. 20 (a) is a schematic sectional view of the illumination device 100, and FIG. 20 (b) is a diagram showing an example of the structure of a laser light source LD. The illumination device 100 includes a light source LS and a light guide 140. The light source LS includes the laser light source LD and optical lenses (120 and 130). The light source LS and the light guide 140 are illustrated by way of example only and do not necessarily have the illustrated structures.

As shown in FIG. 20 (b), the laser light source LD includes a red laser light source (hereinafter referred to as an R light source) LDR which emits red laser light (hereinafter referred to as R light), a green laser light source (hereinafter referred to as a G light source) LDG which emits green laser light (hereinafter referred to as G light), and a blue laser light source (hereinafter referred to as a B light source) LDB which emits blue laser light (hereinafter referred to as B light). The R light source LDR, the G light source LDG and the B light source LDB emit the R light, the G light and the B light which are polarized in the same direction, for example. For example, the R light source LDR, the G light source LDG and the B light source LDB include collimating lenses, respectively, and emit parallel light. The R light, the G light and B light are combined with each other by a dichroic mirror 110, for example. With this, the laser light source LD emits white laser light. Instead, the dichroic mirror 110 may be omitted, and the R light, the G light and the B light may be emitted directly to the light guide 140 and combined with each other inside the light guide 140.

Each of the R light source LDR, the G light source LDG and the B light source LDB shown in the drawing corresponds to the semiconductor laser 1 shown in FIG. 1 or the semiconductor laser set 2 shown in FIG. 10. The set of the R light source LDR, the G light source LDG and the B light source LDB corresponds to the semiconductor laser set 4 shown in FIG. 15 or the semiconductor laser set 5 shown in FIG. 16. The semiconductor laser element of each light source is a side-surface emitting type semiconductor laser having a ridge structure, etc., for example, and is favorable because the polarization state can be easily adjusted.

The optical lens 120 increases the beam width of the laser light emitted from the laser light source LD. The optical lens 130 appropriately converts laser light to parallel light which evenly enters a side surface 141 of the light guide 140. The optical lens 130 is not limited to any particular lens as long as the lens can convert laser light to parallel light, but a diffraction lens or a Fresnel lens can be used, for example.

The light guide 140 is arranged below the display panel PNL. In a Y-Z plane defined by the second direction Y and the third direction Z, the light guide 140 has a wedge-shaped cross-section, for example. The light guide 140 has the side surface 141 opposed to the light source LS, a first main surface 142 opposed to the display panel PNL, and a second main surface 143 located on the opposite side from the first main surface 142. The side surface 141 is a flat surface which is parallel to an X-Z plane defined by the first direction X and the third direction Z. The first main surface 142 is a flat surface which is parallel to an X-Y plane defined by the first direction X and the second direction Y. The second main surface 143 is an inclined surface which is parallel to the first direction X and intersects the second direction Y and the third direction Z. The second main surface 143 is gently inclined such that the laser light entering from the side surface 141 satisfies conditions of total reflection. The second main surface 143 is inclined such that the reflected laser light is perpendicularly transmitted to the first main surface 142. The light guide 140 is elongated throughout the entire region corresponding to the display area DA of the display panel PNL.

The light guide 140 is formed of light transmissive resin, for example. Further, to maintain the polarization direction of the laser light which passes through the light guide 140, the light guide 140 should preferably have a low level of birefringence. The retardation of the light guide 140 should preferably be less than or equal to one-fourth of the dominant wavelength of the entering laser light. The light guide 140 is formed of a mixture or copolymer of a positive birefringence substance and a negative birefringence substance, for example, and is formed of a polymer having an intrinsic birefringence of an absolute value of less than or equal to $3\times10^{-3}$, for example.

A reflective sheet 150 is provided on the second main surface 143 but may be omitted. The reflective sheet 150 reflects light leaking through the second main surface 143 back to the light guide 140. Further, a prism sheet 160 is provided on the first main surface 142 but may be omitted. The prism sheet 160 refracts and converges light guided by the light guide 140, and evenly illuminates the display panel PNL and increases the luminance of the display panel PNL. A plurality of prisms are formed on a surface of the prism sheet 160 which is opposed to the display panel PNL. In the prism sheet 160, the longitudinal direction of the prisms should preferably be parallel to the polarization direction of the entering laser light. To maintain the polarization direction of the laser light passing through the prism sheet 160, the prism sheet 160 should preferably have a low level of birefringence. The prism sheet 160 having a low level of birefringence can be formed of the same material as that of the light guide 140, for example.

The laser light emitted from the laser light source LD is perpendicularly polarized with respect to the plane of the drawing, for example. The beam width of the laser light emitted from the laser light source LD is increased by the optical lens 120. Subsequently, the laser light is converted to parallel light by the optical lens 130, and for example, while the polarization direction is perpendicularly maintained with respect to the plane of the drawing, the laser light perpendicularly enters the side surface 141. The laser light transmitted through the side surface 141 is reflected off the second main surface 143 as parallel light with the polarization direction maintained, and the laser light is transmitted from the first main surface 142. The laser light may travel through the light guide 140 by repeating reflection a plurality of times inside the light guide 140. As described above, the light guide 140 guides the laser light emitted from the light source LS to the display panel PNL while maintaining the polarization direction of the laser light. The light transmitted from the light guide 140 to the display panel PNL corresponds to illumination light which illuminates the display panel PNL.

Figure 21:
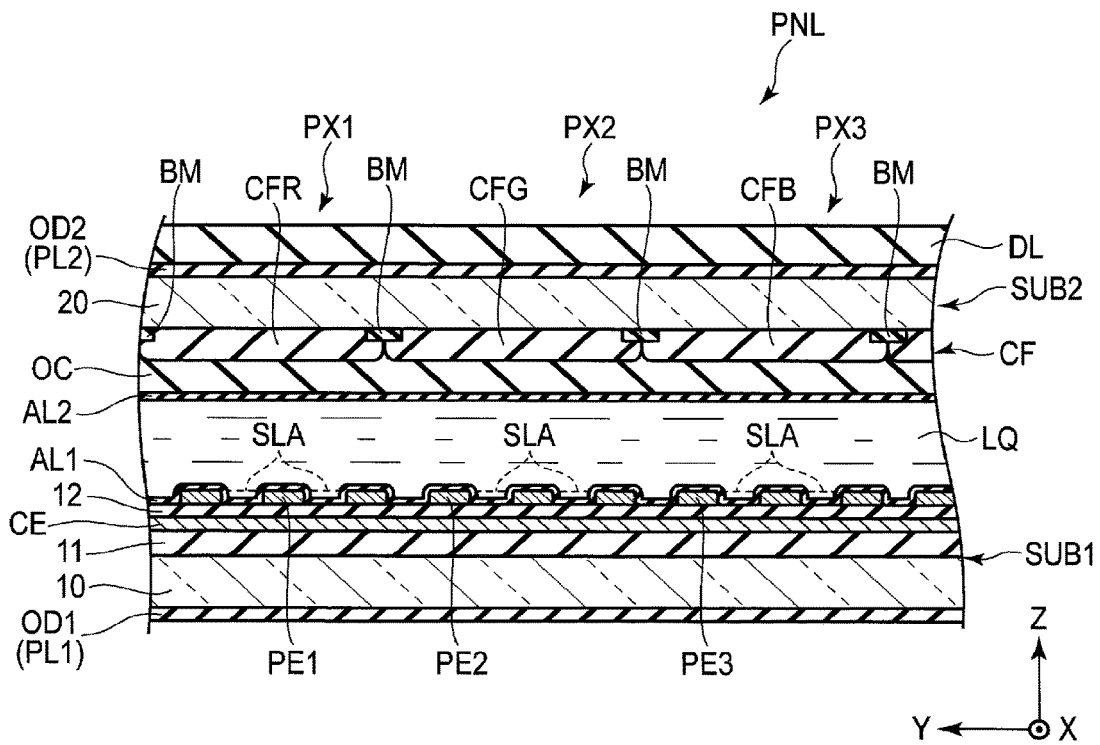
FIG. 21 is a diagram showing a cross-section of a display panel shown in FIG. 18.

FIG. 21 is a schematic sectional view of the display panel PNL shown in FIG. 18. For example, the drawing shows a liquid crystal display device conforming to a display mode using a lateral electric field. However, the display mode of the liquid crystal display device according to the present embodiment is not limited to any particular display mode and may be a display mode using another electric field such as a longitudinal electric field. The display panel PNL includes a first pixel PX1, a second pixel PX2 and a third pixel PX3.

The first substrate SUB1 is formed of a transparent, first insulating substrate 10 such as a glass substrate or a resin substrate. The first substrate SUB1 includes the common electrode CE, pixel electrodes PE1 to PE3, a first insulating film 11, a second insulating film 12, a first alignment film AL1, etc., on a side of the first insulating substrate 10 which is opposed to the second substrate SUB1. The common electrode CE is formed on the first insulating film 11 and is elongated over the first to third pixels PX1 to PX3. The second insulating film 12 covers the common electrode CE. Although not shown in the drawing, the gate line, the source line, the switching element, etc., are formed between the first insulating substrate 10 and the first insulating film 11. The pixel electrodes PE1 to PE3 are formed on the second insulating film 12 and are opposed to the common electrode CE. The pixel electrodes PE1 to PE3 have slits SLA at positions opposed to the common electrode CE. The pixel electrodes PE1 to PE3 are covered with the first alignment film AL1. The common electrode CE and the pixel electrodes PE1 to PE3 are formed of a transparent conductive material such as indium tin oxide or indium zinc oxide, for example.

The second substrate SUB2 is formed of a transparent, second insulating substrate 20 such as a glass substrate or a resin substrate. The second substrate SUB2 includes a light-shielding layer BM, color filters CF, an overcoat layer OC, a second alignment film AL2, etc., on a side of the second insulating substrate 20 which is opposed to the first substrate SUB1. The light-shielding layer BM is formed on an inner surface of the second insulating substrate 20 which is opposed to the first substrate SUB1. The light-shielding layer BM is formed of a black resin material or a light-shielding metal material. The color filters CF are formed on the inner surface of the second insulating substrate 20 and partially overlap the light-shielding layer BM. The color filters CF are opposed to the pixel electrodes PE1, PE2 and PE3, respectively, via the liquid crystal layer LQ.

The color filters CF include a red filter film CFR, a green filer film CFG and a blue filter film CFB. The red filter film CFR, the green filter film CFG and the blue filter film CFB here correspond to the red color filter R-CF, the green color filter G-CF and the blue color filter B-CF which have been described with reference to FIG. 17, respectively.

Further, in the green filter film CFG, the difference between the wavelength of light at which the green filter film CFG has a maximum transmittance and the wavelength of light at which the green filter film CFG has a transmittance of 10% on the short-wavelength side is less than or equal to 70 nm and should preferably be less than or equal to 60 nm. Further, in the green filter film CFG, the wavelength of light at which the green filter film CFG has a transmittance of 10% on the short-wavelength side should preferably be longer than the dominant emission wavelength of the B light. Further, in the green filter film CFG, the transmittance of light having the dominant emission wavelength of the B light should preferably be less than or equal to 5%. According to these structures, the green filter film CFG has narrow-range spectral transmittance characteristics, and the transmittance of the B light decreases and the color purity of light transmitted through the green filter film CFG increases. In the green filter film CFG, the wavelength of light at which the green filter film CFG has a maximum transmittance should preferably be greater than or equal to 520 nm and less than or equal to 540 nm and more preferably be greater than or equal to 525 nm and less than or equal to 538 nm. The area of the green filter film CFG should preferably be larger than the areas of the red filter film CFR and the blue filter film CFB.

In the blue filter film CFB, for example, the wavelength of light at which the blue filter film CFB has a maximum transmittance is 435 nm to 480 nm. In the blue filter film CFB, the difference between the wavelength of light at which the blue filter film CFB has the maximum transmittance and the wavelength of light at which the blue filter film CFB has a transmittance of 10% on the low-wavelength side should preferably be less than or equal to 70 nm and more preferably be less than or equal to 60 nm. Further, in the blue filter film CFB, the wavelength of light at which the blue filter film CFB has the maximum transmittance should preferably be shorter than the dominant emission wavelength of the B light. According to these structures, the blue filter film CFB has narrow-range spectral transmittance characteristics, and the transmittance of the G light decreases and the color purity of light transmitted through the blue filter film CFB increases.

The overcoat layer OC covers the color filters CF. The overcoat layer OC is formed of a transparent resin material. The overcoat layer is covered with the second alignment film AL2. The first alignment film AL1 and the second alignment film AL2 are formed of a material exhibiting a horizontal alignment property.

The first substrate SUB1 and the second substrate SUB2 are attached to each other with a predetermined cell gap. The liquid crystal layer LQ is sealed between the first alignment film AL1 and the second alignment film AL2.

A first optical film OD1 including a first polarizer PL1 is arranged below the first substrate SUB1. If the illumination light is polarized, the transmission axis of the first polarizer PL1 should preferably be parallel to the polarization direction of the illumination light. A second optical film OD2 including a second polarizer PL2 is arranged above the second substrate SUB2. For example, a diffusing layer DL including diffusing particles is formed on the second polarizer PL2. The illumination light in the present embodiment is parallel light, and the light transmitted through the display panel PNL is also parallel light. Therefore, as the transmitted light is diffused by the diffusing layer DL, unevenness of luminance in the X-Y plane can be avoided. Therefore, the diffusing layer DL should preferably be provided. The diffusing particles are not limited to any particular particles as long as the particles can diffuse light, and may be organic particles or inorganic particles, but should preferably be inorganic particles. The inorganic particles should preferably be the particles of inorganic oxide such as silica or alumina.

The color filters CF are formed on the second substrate SUB2 in the example illustrated but may be formed on the first substrate SUB1. For example, the color filters CF may be replaced with the first insulating film 11 or may be interposed between the first insulating substrate 10 and the first insulating film 11. Further, parameters of the red, green and blue filters may be measured in a state where other light transmissive materials such as glass substrates, polarizers, insulating layers and pixel electrodes are formed. It is because these materials only have negligibly-small impacts on the measurement. In the example illustrated, the display panel PNL has a structure in which the pixel electrode PE and the common electrode CE are formed on the first substrate SUB1, but is not limited to this structure, and may have various structures appropriately in accordance with the display mode of the display panel PNL.

In the display device DSP according to the present embodiment, the light emitted from the light source LS is guided to the color filters CF by the light guide 140. The polarization direction of the illumination light emitted from substantially the entire first main surface 142 is perpendicular to the plane of the drawing and is parallel to the transmission axis of the first polarizer PL1, for example. Therefore, the illumination light is hardly absorbed but is mostly transmitted through the first polarizer PL1. At this time, the illumination light is transmitted through the liquid crystal layer LQ without impairment of the parallel property, and is substantially perpendicularly emitted to the color filters CF. As described above, the green filter film CFG has narrow-range spectral transmission characteristics and does not easily transmit the B light as compared to conventional color filters. Therefore, the transmittance of the B light in the green filter film CFG decreases, and the color purity of light transmitted through the green filter film CFG increases. As a result, the color gamut of the display device DSP can be close to the target color gamut and can be expanded.

Further, if the polarization direction of the illumination light and the transmission axis of the first polarizer PL1 are parallel to each other, light use efficiency can be improved. Accordingly, the display device DSP can emit high-luminance light with low power consumption. In the case of manufacturing the transparent display device DSP, the first polarizer PL1 may not be provided.

As described above, according to the present embodiment, a semiconductor laser, a semiconductor laser set and a display device which can reduce speckle noise can be provided.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

What is claimed is:

1. A semiconductor laser comprising a semiconductor laser element, wherein
   a drive current which is composed of a direct current and an alternating current superposed thereon is applied to the semiconductor laser element,
   a waveform of the alternating current is a non-square wave,
   a frequency of the alternating current is from 50 Hz to 500 kHz, and
   a dominant emission wavelength of the semiconductor laser is greater than 467 nm and less than or equal to 485 nm, greater than 532 nm and less than or equal to 555 nm, or greater than 630 nm and less than or equal to 655 nm.

2. The semiconductor laser of claim 1, wherein the non-square wave is a sine wave or a triangle wave.

3. The semiconductor laser of claim 1, wherein a wavelength difference between a dominant emission wavelength and a shortest wavelength is greater than a wavelength difference between the dominant emission wavelength and a longest wavelength in an emission wavelength range of the semiconductor laser.

4. A semiconductor laser set comprising two or more of the semiconductor laser of claim 1, wherein the semiconductor lasers emit light having substantially same colors and have different dominant emission wavelengths.

5. The semiconductor laser set of claim 4, wherein emission wavelength ranges of the semiconductor lasers partially overlap each other.

6. The semiconductor laser set of claim 4, wherein the non-square wave is a sine wave or a triangle wave.

7. The semiconductor laser set of claim 4, wherein a wavelength difference between a dominant emission wavelength and a shortest wavelength is greater than a wavelength difference between the dominant emission wavelength and a longest wavelength in an emission wavelength range of each of the semiconductor lasers.

8. A semiconductor laser set comprising:
   a first semiconductor laser; and
   a second semiconductor laser, wherein
   each of the first semiconductor laser and the second semiconductor laser is the semiconductor laser of claim 1,
   a dominant emission wavelength of the first semiconductor laser is greater than or equal to 467 nm and less than or equal to 485 nm,
   a dominant emission wavelength of the second semiconductor laser is greater than or equal to 532 nm and less than or equal to 555 nm, and
   a wavelength difference between the dominant emission wavelength of the first semiconductor laser and the dominant emission wavelength of the second semiconductor laser is greater than or equal to 65 nm and less than or equal to 88 nm.

9. The semiconductor laser set of claim 8, comprising two or more of the first semiconductor laser which emit light having substantially same colors with a first color and have different dominant emission wavelengths, or comprising two or more of the second semiconductor laser which emit light having substantially same colors with a second color different from the first color and have different dominant emission wavelengths.

10. The semiconductor laser set of claim 8, wherein the non-square wave is a sine wave or a triangle wave.

11. A display device comprising:
    the semiconductor laser set of claim 8; and
    a color filter having a maximum transmittance at a wavelength of greater than or equal to 450 nm and less than or equal to 480 nm, wherein
    the color filter has a maximum transmittance at a first wavelength, a transmittance of 10% at a second wavelength which is shorter than the first wavelength, and a transmittance of 10% at a third wavelength which is longer than the first wavelength, and
    B/A is less than or equal to 0.75 where A is a wavelength difference between the first wavelength and the second wavelength and B is a wavelength difference between the first wavelength and the third wavelength.

12. The semiconductor laser set of claim 9, further comprising a third semiconductor laser, wherein
    a dominant emission wavelength of the third semiconductor laser is greater than or equal to 600 nm and less than or equal to 650 nm.

13. The display device of claim 11, comprising two or more of the first semiconductor laser which emit light having substantially same colors with a first color and have different dominant emission wavelengths, or comprising two or more of the second semiconductor laser which emit light having substantially same colors with a second color different from the first color and have different dominant emission wavelengths.

14. The display device of claim 13, further comprising a third semiconductor laser, wherein
    a dominant emission wavelength of the third semiconductor laser is greater than or equal to 600 nm and less than or equal to 650 nm.

* * * * *